(12) United States Patent
Niu et al.

(10) Patent No.: US 11,151,006 B2
(45) Date of Patent: Oct. 19, 2021

(54) HBM RAS CACHE ARCHITECTURE

(71) Applicant: Samsung Electronics Co., Ltd., Suwon-si (KR)

(72) Inventors: Dimin Niu, Sunnyvale, CA (US); Krishna Malladi, San Jose, CA (US); Hongzhong Zheng, Los Gatos, CA (US)

(73) Assignee: SAMSUNG ELECTRONICS CO., LTD.

( * ) Notice: Subject to any disclaimer, the term of this patent is extended or adjusted under 35 U.S.C. 154(b) by 174 days.

(21) Appl. No.: 16/150,239

(22) Filed: Oct. 2, 2018

(65) Prior Publication Data
US 2020/0004652 A1    Jan. 2, 2020

Related U.S. Application Data

(60) Provisional application No. 62/692,960, filed on Jul. 2, 2018.

(51) Int. Cl.
| G06F 11/00 | (2006.01) |
| G06F 11/20 | (2006.01) |
| G06F 3/06 | (2006.01) |

(52) U.S. Cl.
CPC ........ *G06F 11/2094* (2013.01); *G06F 3/0619* (2013.01); *G06F 3/0635* (2013.01); *G06F 3/0659* (2013.01); *G06F 3/0688* (2013.01); G06F 2201/82 (2013.01)

(58) Field of Classification Search
CPC ............ G06F 11/2094; G06F 11/1658; G06F 11/1662; G06F 11/1004; G06F 3/0619; G06F 3/0688
See application file for complete search history.

(56) References Cited

U.S. PATENT DOCUMENTS

| 8,898,437 | B2 | 11/2014 | Smith et al. | |
| 2006/0080572 | A1 | 4/2006 | Fong | |
| 2010/0070809 | A1 | 3/2010 | Dempsey et al. | |
| 2014/0376320 | A1* | 12/2014 | Loh | G11C 29/76 365/200 |
| 2015/0199246 | A1* | 7/2015 | Miyazaki | G06F 11/2094 714/6.13 |
| 2015/0235716 | A1 | 8/2015 | O'Connell | |

\* cited by examiner

*Primary Examiner* — Philip Guyton
(74) *Attorney, Agent, or Firm* — Renaissance IP Law Group LLP

(57) ABSTRACT

According to one general aspect, an apparatus may include a plurality of stacked integrated circuit dies that include a memory cell die and a logic die. The memory cell die may be configured to store data at a memory address. The logic die may include an interface to the stacked integrated circuit dies and configured to communicate memory accesses between the memory cell die and at least one external device. The logic die may include a reliability circuit configured to ameliorate data errors within the memory cell die. The reliability circuit may include a spare memory configured to store data, and an address table configured to map a memory address associated with an error to the spare memory. The reliability circuit may be configured to determine if the memory access is associated with an error, and if so completing the memory access with the spare memory.

20 Claims, 8 Drawing Sheets

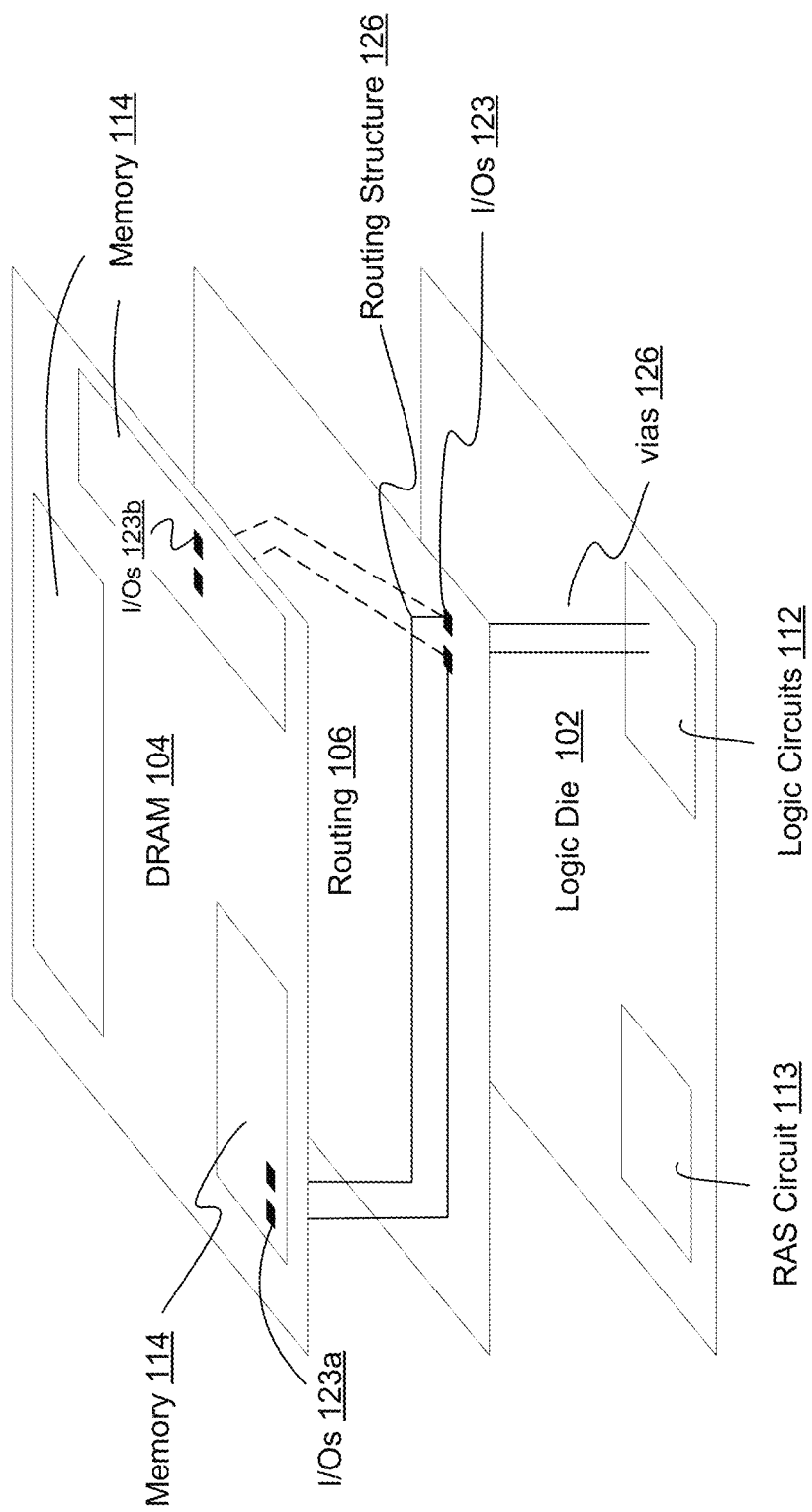

FIG. 2A
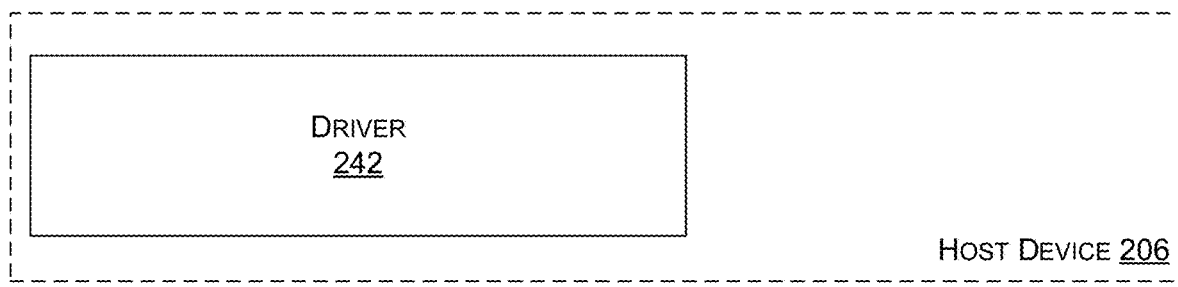
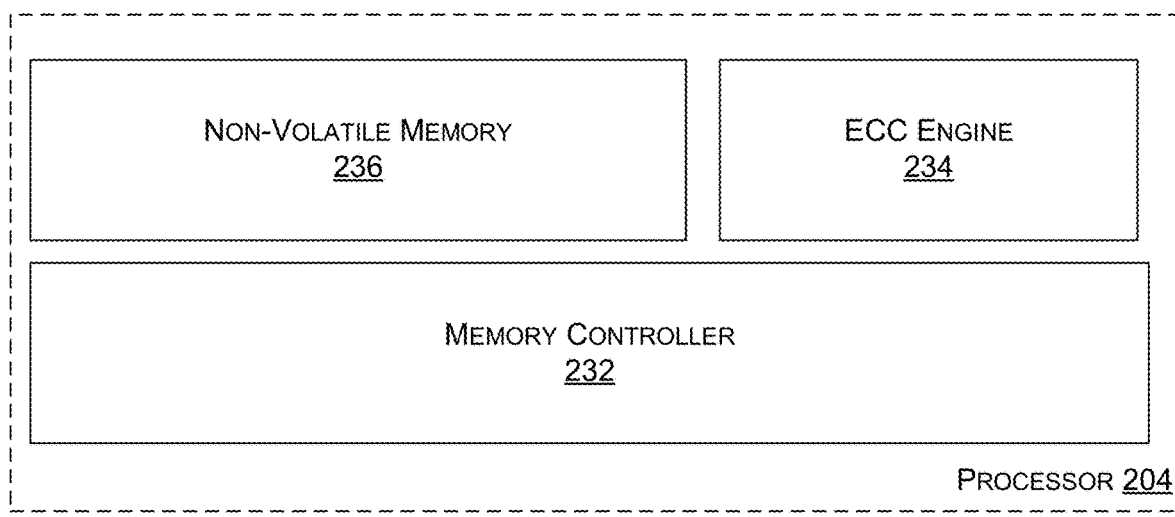
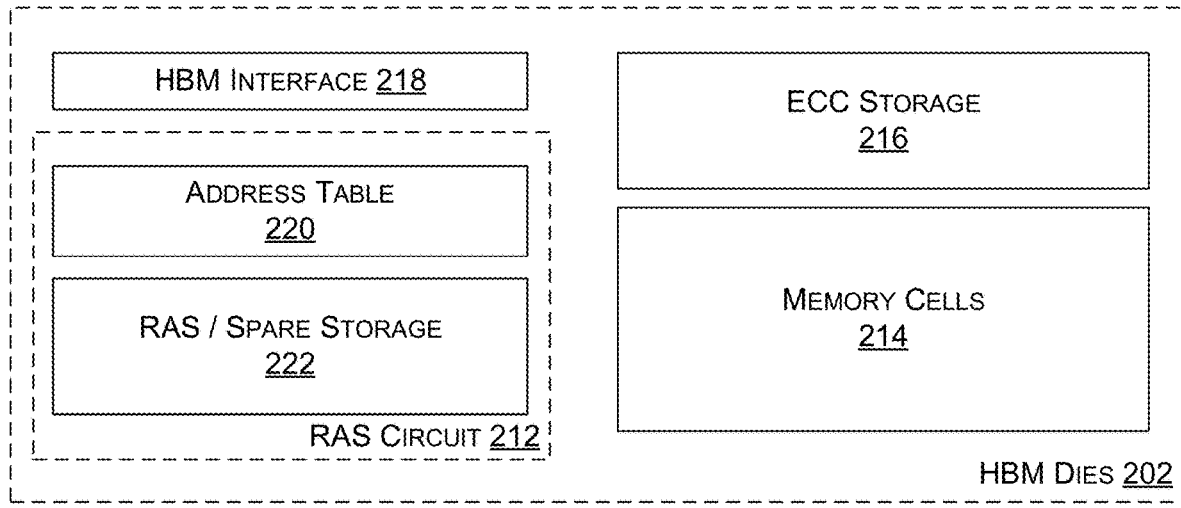

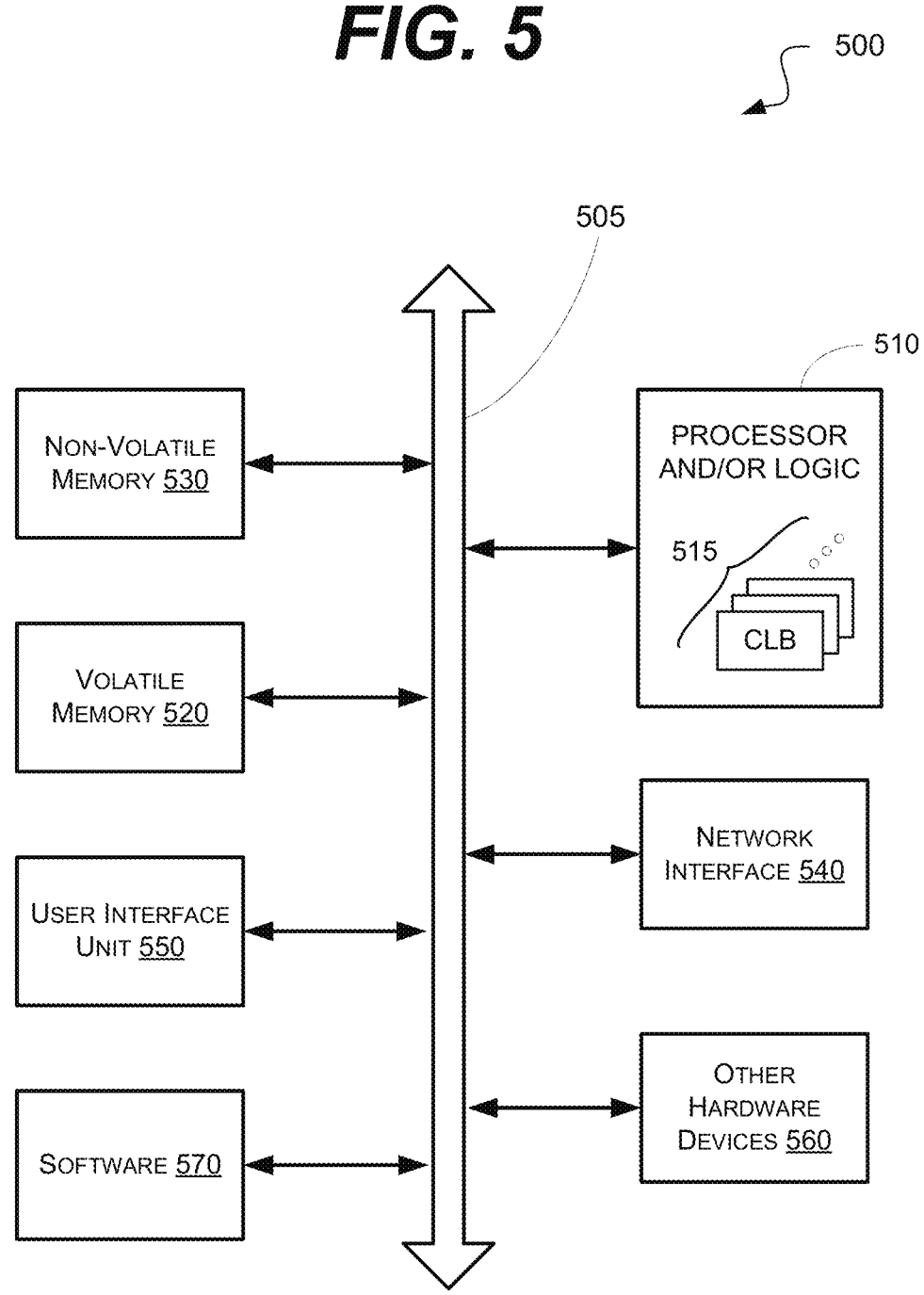

HBM RAS CACHE ARCHITECTURE

CROSS-REFERENCE TO RELATED APPLICATION

This application claims priority under 35 U.S.C. § 119 to Provisional Patent Application Ser. No. 62/692,960, entitled "HBM RAS CACHE ARCHITECTURE" filed on Jul. 2, 2018. The subject matter of this earlier filed application is hereby incorporated by reference.

TECHNICAL FIELD

This description relates to memory error correction, and more specifically to a high-bandwidth memory (HBM) reliability, accessibility, and serviceability (RAS) cache architecture.

BACKGROUND

High Bandwidth Memory (HBM) is a high-performance random-access memory (RAM) interface for stacked dynamic RAM (DRAM). It is generally used in conjunction with high-performance graphics accelerators and network devices. The first devices to use HBM were graphical processing units (GPUs).

HBM achieves higher bandwidth while using less power in a substantially smaller form factor than double data rate fourth-generation synchronous DRAM (DDR4) or double data rate type five synchronous graphics random-access memory (GDDR5). This is often achieved by stacking numerous (e.g., 8) DRAM dies, including an optional base die with a memory controller, which are interconnected by through-silicon vias (TSV) and microbumps.

HBM memory bus is very wide in comparison to other DRAM memories such as DDR4 or GDDR5. An HBM stack of four DRAM dies (4-Hi) generally has two 128-bit channels per die for a total of 8 channels and a width of 1024 bits in total. A graphics card/GPU with four 4-Hi HBM stacks would therefore have a memory bus with a width of 4096 bits. In comparison, the bus width of GDDR memories is 32 bits, with 16 channels for a graphics card with a 512-bit memory interface.

The larger number of connections to the memory, relative to DDR4 or GDDR5, required a new method of connecting the HBM memory to the GPU (or other processor). Some companies use purpose built silicon chips, called interposers, to connect the memory and GPU. This interposer has the added advantage of requiring the memory and processor to be physically close, decreasing memory paths. However, as semiconductor device fabrication is significantly more expensive than printed circuit board manufacture, this adds cost to the final product.

SUMMARY

According to one general aspect, an apparatus may include a plurality of stacked integrated circuit dies. The stacked integrated circuit dies may include a memory cell die and a logic die. The memory cell die may be configured to store data in a random access fashion based upon a memory address. The logic die may include an interface to the plurality of stacked integrated circuit dies and configured to communicate memory accesses between the memory cell die and at least one external device. The logic die may include a reliability circuit configured to ameliorate data errors within the memory cell die. The reliability circuit may include a spare memory configured to store data in a random access fashion, and an address table configured to map a memory address associated with an error to a portion of the spare memory. The reliability circuit may be configured to, when a memory access to the plurality of stacked integrated circuit dies occurs, determine if the memory access is associated with an error, and if so completing the memory access with, at least in part, the spare memory.

According to another general aspect, a system may include a processor that includes a memory controller configured to manage a flow of data going to and from the processor, and an error correction circuit configured to detect if an error has occurred to stored data. The system may include a high-bandwidth memory stack of integrated circuits that include high-bandwidth memory cells configured to store data based upon a memory address; and a reliability circuit configured to ameliorate data errors within the high-bandwidth memory cells. The reliability circuit may include a spare memory configured to store data, and an address table configured to map a memory address associated with the error to a portion of the spare memory. The reliability circuit is configured to, when a memory access to the high-bandwidth memory stack of integrated circuits occurs, determine if the memory access is associated with an error, and if so completing the memory access with, at least in part, the spare memory.

According to another general aspect, an apparatus may include a logic die that includes an internal interface to high-bandwidth memory dies, wherein the high-bandwidth memory dies are configured to store data based upon a memory address. The logic die may include an external interface configured to communicate memory accesses between the high-bandwidth memory dies and at least one external device. The logic die may include a reliability circuit configured to ameliorate data errors within the high-bandwidth memory dies. The reliability circuit may include a spare memory configured to store data, and an address table configured to map a memory address associated with an error to a portion of the spare memory. The reliability circuit may be configured to, when a memory access to the high-bandwidth memory dies occurs, determine if the memory access is associated with an error, and if so completing the memory access with, at least in part, the spare memory.

The details of one or more implementations are set forth in the accompanying drawings and the description below. Other features will be apparent from the description and drawings, and from the claims.

A system and/or method for memory error correction, and more specifically to a high-bandwidth memory (HBM) reliability, accessibility, and serviceability (RAS) cache architecture, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

FIG. 2A is a block diagram of an example embodiment of a system in accordance with the disclosed subject matter.

FIG. 5 is a schematic block diagram of an information processing system that may include devices formed according to principles of the disclosed subject matter.

Like reference symbols in the various drawings indicate like elements.

DETAILED DESCRIPTION

Figure 2B:
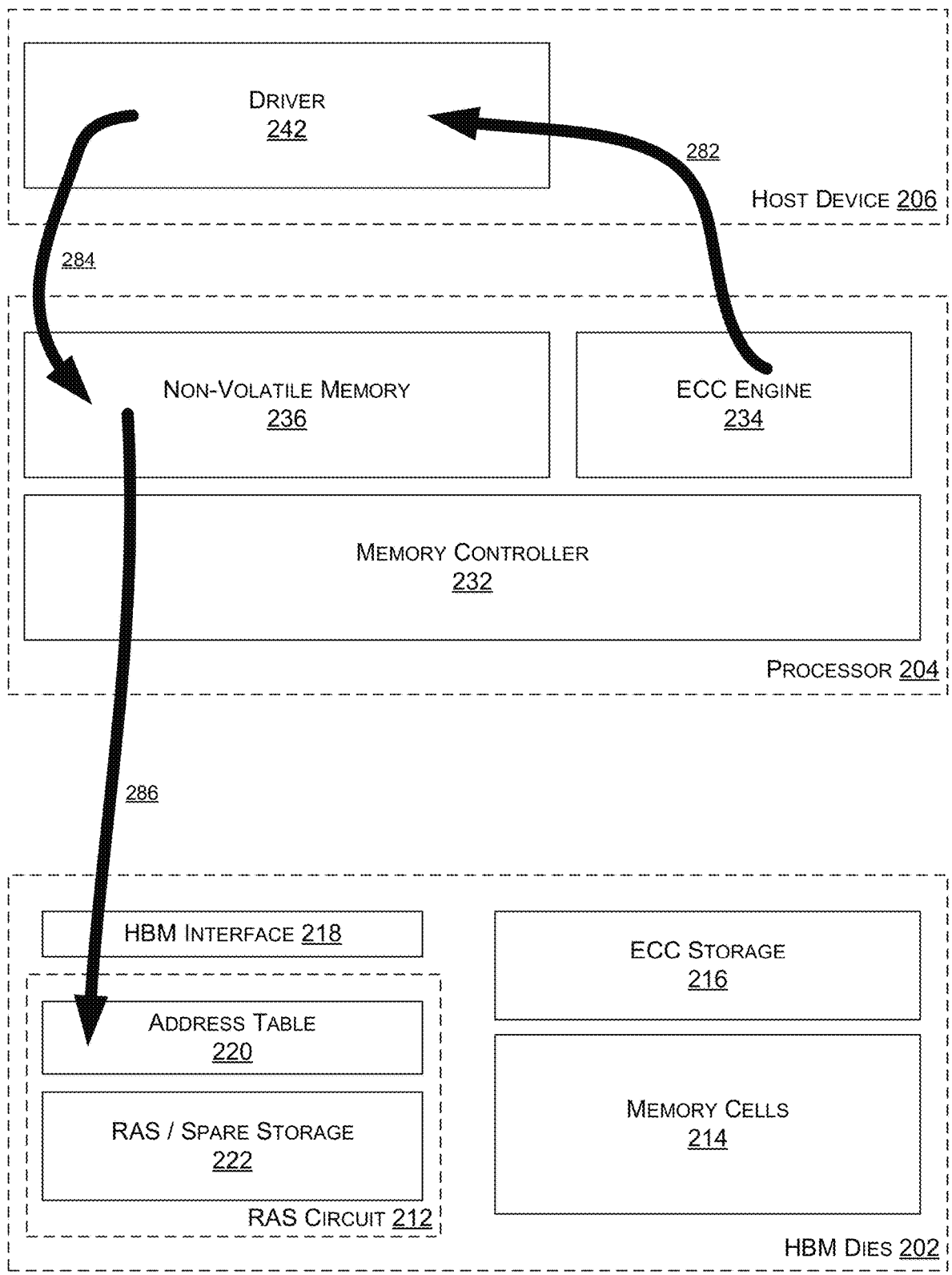
FIG. 2B is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is an isometric block diagram of an example embodiment of a system 100 in accordance with the disclosed subject matter. In the illustrated embodiment, a number of integrated circuit dies may be stacked (or otherwise) integrated to form a multi-chip system. In various embodiments, this multi-chip system 100 may include an RAS cache or circuit, as described below.

In various embodiments, a High Bandwidth Memory (HBM) may include a high-performance form of random access memory (RAM). In some embodiments, HBM may include stacked dynamic RAM (DRAM) memory that communicates using through-silicon vias (TSV). Generally, High Bandwidth Memory combines through-silicon vias (TSV) and microbumps to connect multiple (e.g., 4, 8, etc.) dies of memory cell arrays on top of each other. In some embodiments, a memory controller may be included on a separate die at the very bottom of the stack.

In the illustrated embodiment, the system 199 may include one or more memory (e.g., DRAM, etc.) dies 104 and a logic die 102. In one embodiment, the memory die(s) 104 and the logic die 102 may or may not be created or manufactured using the same manufacturing process.

In the illustrated embodiment, the memory die 104 may include a number of memory arrays 114. In such an embodiment, the memory arrays 114 may be configured to store various pieces of data. In some embodiments, the data may be accessed by the logic die 102 or an external device (e.g., an external processor or host, as described below).

In the illustrated embodiment, the logic die 102 may include one or more logic circuits 112. In such an embodiment, the logic circuits 112 may include an interface for accepting read/write requests or more generally memory accesses to read or store data within the memories 114. In various embodiments, the logic die 102 may include an RAS cache or circuit 113, as described below.

In various embodiments, the logic circuits 112 may communicate with the memory 114 using one or more vias 126 (or microbumps, etc.). In such an embodiment, this may allow high speed communication between the processing element (e.g., logic circuits 112) and the stored data (memory 114) without the need for communication over a bus or an external interface.

In various embodiments, the system 100 may also include a routing die 106. The routing die 106 may be configured to dynamically route signals between the logic die 112 and memory die(s) 104. In various embodiments, the routing die 106 may be coupled with the logic die 102 by one or more vias 126. The vias 126 (or a portion thereof) may end in input/output (I/O) terminals or interfaces 123. In such an embodiment, the routing die 106 may dynamically route signals between the I/O interfaces 123 and the memories 114 that store the desired data.

In various embodiments, the routing may be accomplished by a routing structure 126. In various embodiments, the routing structure 126 may include various routing devices, such as, for example, multiplexers, de-multiplexers, crossbar switches, switches, rotary switch, memory switch, crossover switch, etc. It is understood that the above are merely a few illustrative examples to which the disclosed subject matter is not limited.

In some embodiments, the routing structure 126 may be configured to route the input/output signals between the I/O interfaces 123 of the logic circuits 112 and similar I/O interfaces 123a or 123b of the memories 114. In the illustrated embodiment, two possible routing schemes are shown. For example, the solid line shows a first route that may be employed to connect the logic circuits 112 to the I/O interfaces 123a of a first memory (shown in the lower left corner of the memory die 104). In another example, the dashed lines show a second route that may be employed to connect the logic circuits 112 to the I/O interfaces 123b of a second memory (shown in the right side of the memory die 104). However, in various embodiments, the memories 114 may be monolithic and not partitioned as shown. It is understood that the above are merely a few illustrative examples to which the disclosed subject matter is not limited.

FIG. 2A is a block diagram of an example embodiment of a system 200 in accordance with the disclosed subject matter. In various embodiments, the 200 may be part of a number of discrete integrated circuits, a MCM, and/or a system-on-a-chip (SoC). In various embodiments, the system 200 may be used in a computing device, such as, for example, a laptop, desktop, workstation, personal digital assistant, smartphone, tablet, and other appropriate computers or a virtual machine or virtual computing device thereof.

In one embodiment, the system 200 may include a host device 206. In various embodiments, this host device may include a central processing unit (CPU), a motherboard, computing system. In various embodiments, the host device 206 may include a processor (not shown) that executes instructions and generally read and stores data. As part of this, the host device 206 may execute a driver software or firmware 242. In the illustrated embodiment, the device driver 242 may include a computer program that operates or controls a particular type of device that is attached to a computer (e.g., the processor 204 or HBM dies 202). In such an embodiment, the driver 242 may provide a software interface to hardware devices, enabling operating systems and other computer programs to access hardware functions without needing to know precise details about the hardware being used.

In the illustrated embodiment, the system 200 may include a processor 204. In various embodiments, the processor 204 may include one of many types of processors (e.g., a graphics processor, a central processor, a device specific processor, a physics processor, etc.). For ease of illustration, the processor 204 will be described as a graphics processing unit (GPU); although, it is understood that the above is merely one illustrative example to which the disclosed subject matter is not limited. In various embodiments, the GPU 204 may be employed for generating graphics data or for massively parallel computing tasks.

In various embodiments, the processor 204 may include a memory controller 232. In such an embodiment, the memory controller 232 may be configured to manage the flow of data going to and from the processor 204. Specifically, in the illustrated embodiment, the memory controller 232 may be configured to manage the flow of data going between the processor 204 and the HBM dies 202.

In the illustrated embodiment, the processor 204 may include an error correcting or correction (ECC) engine or circuit 234. In such an embodiment, the ECC engine or circuit 234 may be configured to detect if an error has occurred to some or any of the data received from the HBM dies 202. In various embodiments, the ECC engine 234 may be integrated with or part of the memory controller 232. In various embodiments, the ECC engine may be configured to detect single or double bit errors. It is understood that the above are merely a few illustrative examples to which the disclosed subject matter is not limited.

In the illustrated embodiment, the processor 204 may include a non-volatile memory 236. Although, in various embodiments, the memory may be volatile or exist externally to the processor 204, as described below. In such an embodiment, the non-volatile memory 236 may be configured to store information regarding which memory addresses are associated with an error. In some embodiments, the bad or errored memory addresses may be avoided. In another embodiment, the bad or errored memory addresses may be remapped to good or working memory cells.

As described above, in the illustrated embodiment, by being a non-volatile memory 236, these bad or errored memory addresses may be remembered between power cycling of the processor 204. In another embodiment, volatile memory may be used and the bad or errored memory addresses may have to be re-discovered each power cycle. In another embodiment, the processor 204 may include a local or integrated volatile memory but may store that data in a non-volatile memory that is remote or external to the processor 204 (e.g., a hard drive) when the processor 204 ends a power cycle, and retrieve it when the processor 204 reboots. It is understood that the above are merely a few illustrative examples to which the disclosed subject matter is not limited.

In the illustrated embodiment, the system 100 may include an HBM die or, more accurately, a stack of dies 202, as described above. In various embodiments, the HBM dies 202 may include a plurality of memory cells 214, as described above. In various embodiments, the memory cells 214 may be spread over a plurality of integrated circuit (IC) dies and configured to store data at respective memory addresses.

In various embodiments, the HBM dies 202 may include ECC storage of memory cells 216. In such an embodiment, the ECC storage 216 may include extra bits of information (e.g., parity) to allow or facilitate the detection of errors within the data stored in the memory cells 214. In various embodiments, the ECC storage 216 may be part of the memory cells 214 and, even if physically separate, may be likewise spread over a plurality of integrated circuit (IC) dies, as described above. In such an embodiment, this ECC data may be used by the ECC engine 234 to detect any errors.

In various embodiments, the HBM dies 202 may include an HBM interface 218 configured to communicate with or between the processor 204 and/or the host device 206. In various embodiments, the system 200 may include a one or more communication buses (not shown) to facilitate inter-die (e.g., processor 204 to HBM dies 202) communication. In such an embodiment, this may include the transmission of memory accesses, such as requests and responses.

In various embodiments, the HBM dies 202 may include a reliability, accessibility, and serviceability (RAS) cache or circuit 212 (or reliability circuit 212). In such an embodiment, the RAS circuit 212 may not be configured to act as a traditional cache, storing a small amount of data in a quickly accessible way, while a larger memory provides further storage. Instead, the RAS cache or circuit 212 may be configured to act as a backup or spare memory to correct (or appear to correct) or otherwise ameliorate errors found within the memory cells 214. As described below, traditionally once an error is detected in the memory cells 214 it may not be repaired or corrected without taking extensive and time consuming action. With the RAS cache or circuit 212, such repair or correction may occur more quickly and efficiently.

In various embodiments, the RAS circuit 212 may include an RAS or spare memory or storage 222. In various embodiments, the spare storage 222 may be configured to store data for portions of the memory cells 214 that are associated with an error or otherwise in disrepair. The operation of these components will be described below.

In various embodiments, the RAS circuit 212 may include an address table 220 configured to store a list of memory addresses (within the memory cells 214) that are associated with an error, and to map such a memory address error to a portion of the spare memory 222.

FIG. 2B is a block diagram of an example embodiment of a system 200 in accordance with the disclosed subject matter. The system 200 of FIG. 2B shows the flow of information and the relative timing of events as the system detects an error. It is understood that the above is merely one illustrative example to which the disclosed subject matter is not limited.

A traditional GPU's memory error management, in terms of error handling and detection, generally proceeds as follows. First, a non-recoverable error is detected by the ECC engine 234. Often this error is associated with a specific memory address of the memory cells 214 and generally involves a double bit error or two single bit errors. This error may be reported to the driver 242

In such an embodiment, the driver 242 in turn may report the error to the application (not shown) or a portion of the host device 206. The driver 242 may also log the memory error into the GPU's non-volatile memory 236. Traditionally, the system would be unable to ameliorate or prevent the recurrence of such an error while the current GPU interaction was occurring.

However, upon next reattachment, reset, reboot of the system, or next sequence or series of GPU interactions, the framebuffer manager (not shown, but part of the processor 204) may blacklist the retired pages having the errors. In such an embodiment, the memory addresses or pages may no longer be used for storage. As such, the memory addresses or pages are permanently retired, and the functional capacity of the memory is reduced.

This traditional process has some drawbacks. First, it is impossible to blacklist pages while clients (e.g., host devices or the software that runs on them) remain active. Second, the number of pages or memory addresses that can be retired on current GPUs is limited due, in part, to the current NVM capabilities of the GPUs. Third, there is a large retire granularity; that is, a 2-bit error results in the retirement of a 4 KB (kilobyte) page. Further, this traditional process ultimately results in a reduction in memory capacity and more as more portions of the memory cells 214 are black listed.

In the illustrated embodiment, the system 200 remedies the situation by providing for extra logic and memory on an HBM module or dies 202 to cache and repair errors. In detail, an RAS circuit 212 is implemented on the HBM logic die, of a size of at least a few kilobytes; although, it is understood that the above is merely an illustrative example to which the disclosed subject matter is not limited. This RAS circuit includes an index region or address table 220 to store addresses received by the host 206 or processor 204, and may be protected by the HBM dies' 202 internal error correction mechanism. The RAS circuit 212 may also include a data region or spare storage 222, which is configured to store repaired data (which could be of any given size). The table 220 and the storage 222 region may have a 1-1 mapping. Further, these regions can be embodied with any technology compatible with the HBM logic die (such as DRAM, SRAM, Flash, etc.).

In the illustrated embodiment, again, the error detection process may start with the ECC engine 234 detecting that an error has occurred at a given memory address. As shown by arrow 282, the ECC engine 234 may alert the driver 242, as described above. Again, as shown by arrow 284, the driver 242 may record this in the non-volatile memory 236.

However, instead of blacklisting the memory address or page, and waiting to do so until the processor 204 is no longer in immediate use, the processor 204 (shown via arrow 286) may inform the HBM die 202 (or the logic die of the HBM dies 202) that a given memory address is bad. The HBM dies 202, and more specifically the RAS circuit 212, may then take corrective action.

In the illustrated embodiment, the RAS circuit 212 may log or enter the bad memory address into the address table 220. The bad memory address may be mapped to a portion or memory address of the spare storage 222. In various embodiments, the data included in the memory cells 214 at the memory address may be copied (error and all) to the mapped portion of the spare storage 222. In various embodiments, this may not be desirable as the data does include the error. In such an embodiment, the processor 204 may require that new data (data without an error) be written into the HBM die 202 before it may be rad back. It is understood that the above are merely a few illustrative examples to which the disclosed subject matter is not limited.

In such an embodiment, once a new memory access (e.g., read or write) is made to a memory address, the RAS circuit 212 checks whether or not the memory address is in the address table 220 (and hence associated with an error). If not, the memory access processed normally. The memory access is fulfilled by the memory cells 214. If the memory address is associated with an error, the memory access is fulfilled by the spare storage 222, specifically the portion of address mapped to by the address table 220.

In such an embodiment, all memory accesses to the bad memory address may be seamlessly (to the processor 204 or host device 206) fulfilled by the spare storage 222. In such an embodiment, this may be accomplished even while the processor 204 is engaged with a client. There is no need to wait until the processor 204 is disengaged, not used, or as part of a reattachment. Secondly, by remapping certain memory addresses to the spare storage 222, the storage capacity of the HBM dies 202 is not reduced. Without blacklisting, the HBM dies 202 appear to have the same amount of storage capacity. Thirdly, the RAS circuit 212 can provide various granularities of memory mapping. Whereas the traditional method requires backlisting and retirement of 4 KB pages, the RAS circuit 212 may allow mapping of cachelines, pages, or other sizes of memory.

In various embodiments, the addition of a new memory address to the address table 220 (arrow 286) may involve the processor 204 (or host device 206) performing a write memory access to a predefined or reserved memory address. In such an embodiment, the RAS circuit 212 may know that any writes to that memory address mean that a new entry is to be placed in the address table 220. In such an embodiment, the data portion of the write memory access may include the bad memory address. In another embodiment, the addition of a new memory address to the address table 220 (arrow 286) may involve the use of a new message type or protocol. It is understood that the above are merely a few illustrative examples to which the disclosed subject matter is not limited.

In various embodiments, the processor 204 or host device 242 may be able to check how much of the spare storage 222 is in use or available for remapping by performing a read memory access to another predefined or reserved memory address. In such an embodiment, the RAS storage may update a register or memory address with the current storage capacity or usage level of the spare storage 222, and the processor 204 or host device 242 may be able to read from that memory address whenever it wishes. In various embodiments, this may be done prior to the operation of arrow 286 in order to confirm that such space is available. In some embodiments, if the spare storage 22 is full or all in use, the processor 204 and host device 206 may fall back to the traditional blacklisting/retirement technique. In another embodiment, the checking of the free capacity of the spare storage 222 may involve the use of a new message type or protocol. It is understood that the above are merely a few illustrative examples to which the disclosed subject matter is not limited.

In various embodiments, when the system 200 initializes (e.g., boots up) the information may be read from the HBM dies 202 (either by the host device 206 or the processor 204). In one embodiment, it may be determined if the HBM die 202 includes or supports an RAS circuit 212. In one embodiment, it may be determined what the level of remapping granularity is used (e.g., 256 bits, 512 bits, etc.). In another embodiment, it may be determined how may cache or spare storage 222 entries and/or address table entries 220 are supported. In various embodiments, these inquires may be made by read memory accesses to predefined or reserved addresses or by special messages or protocols. It is understood that the above are merely a few illustrative examples to which the disclosed subject matter is not limited.

Likewise, in various embodiments, when the system 200 initializes (e.g., boots up) the information or settings may be written to the HBM dies 202 (either by the host device 206 or the processor 204). In one embodiment, a preexisting list of bad memory addresses may be written to the address table 220 (e.g., from the non-volatile memory 236). In another embodiment, a level of remapping granularity (e.g., 256 bits, 512 bits, etc.) may be set for the spare storage 222. It is understood that the above are merely a few illustrative examples to which the disclosed subject matter is not limited.

Figure 2C:
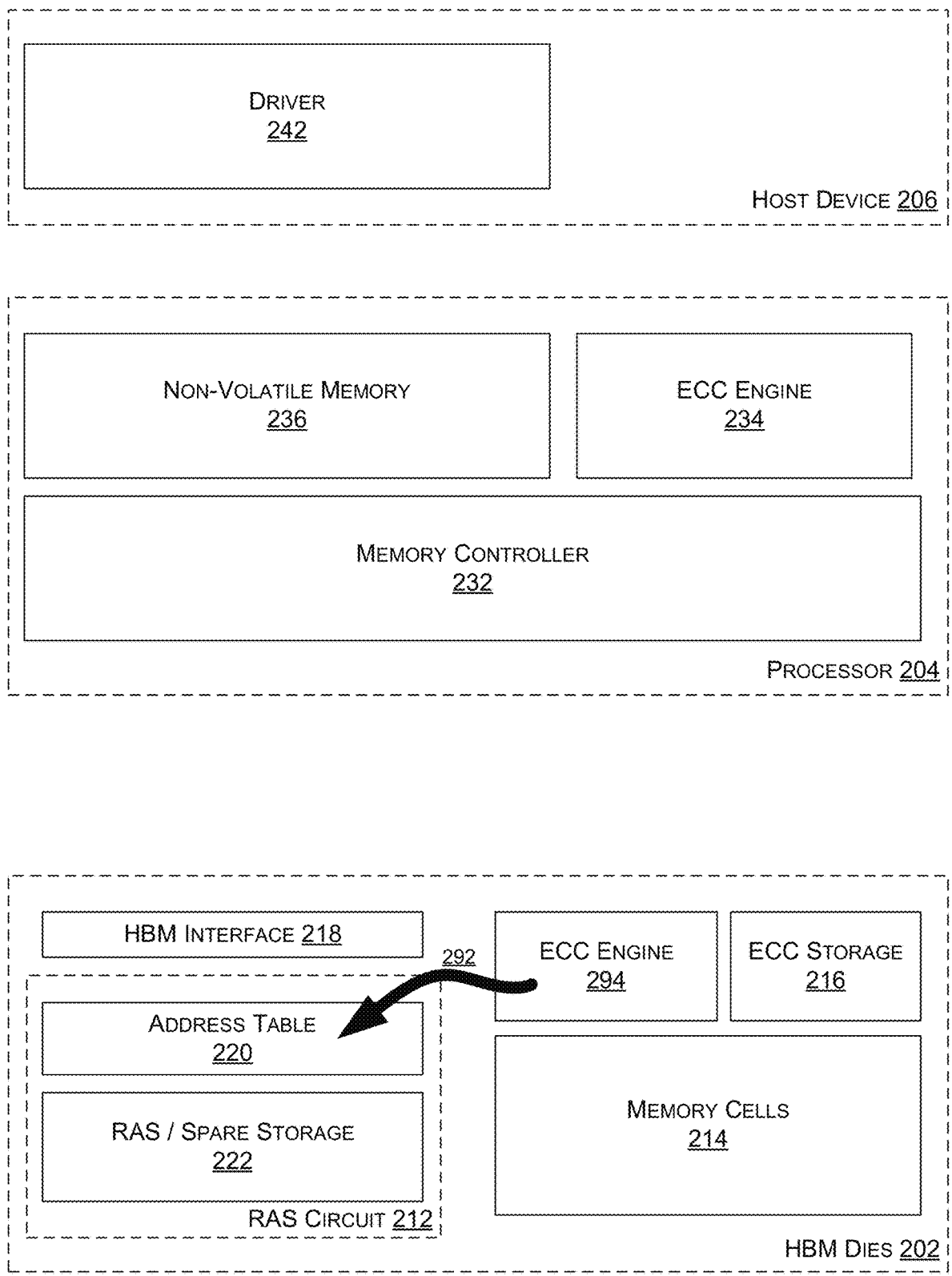
FIG. 2C is a block diagram of an example embodiment of a system in accordance with the disclosed subject matter.

FIG. 2C is a block diagram of an example embodiment of a system 201 in accordance with the disclosed subject matter. In various embodiments, the system 201 shows another variation of the disclosed subject matter.

In such an embodiment, the host device 206 and processor 204 may include the same components as described above. The HBM dies 202, and specifically the logic die, may include their own ECC engine 294. In such an embodiment, the HBM dies 202 may be capable of detecting an error in the memory cells 214 and remapping the bad memory addresses(es) to the spare storage 222, without the assistance of the host device 206 and processor 204. In various embodiments, through the use of non-volatile memories, this remapped may be substantially permanent. Although, in other embodiments, the remapping may occur after every reboot, even if this is less efficient or desired.

In such an embodiment, the ECC engine 294 may detect the error instead of the ECC engine 234. In such an embodiment, the host device 206 and processor 204 may be unaware of any such error. In various embodiments, host device 206 and processor 204 may continue to engage in the traditional blacklisting/retirement technique described above, but due to the HBM dies 202 internal ameliorative efforts such a blacklisting/retirement may not occur or occur only infrequently.

In various embodiments, as illustrated by arrow 292, the HBM dies 202 ECC engine 294 may add the bad memory address to the address table 220. The bad memory address may then be mapped to a portion of the spare storage 222, and any future memory accesses may occur as described above.

Figure 3:
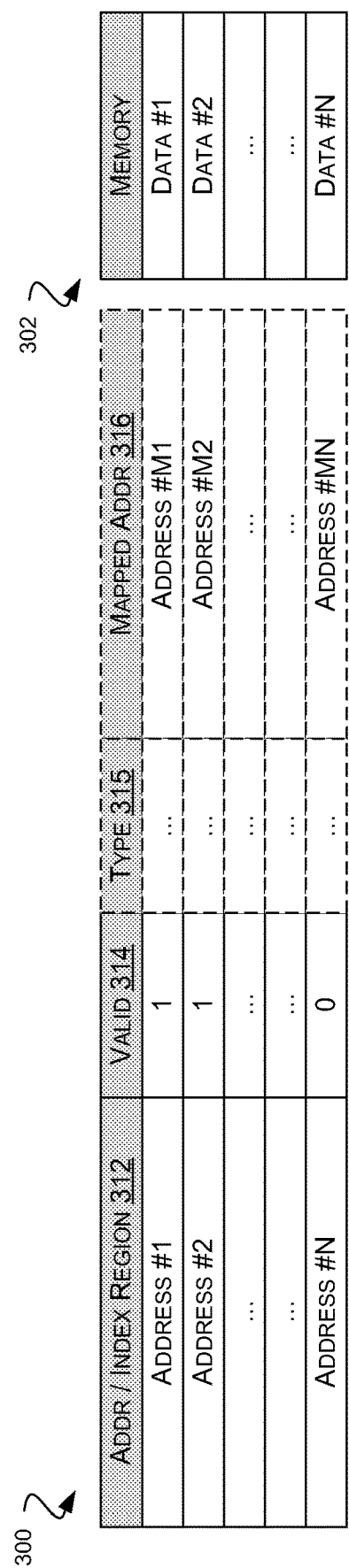
FIG. 3 is a block diagram of an example embodiment of a system in accordance with the disclosed subject matter.

FIG. 3 is a block diagram of an example embodiment of data structures 300 and 302 in accordance with the disclosed subject matter. In the illustrated embodiment, the data structures 300 and 302 may represent the tables and storage of the RAS circuit, as described above.

In the illustrated embodiment, data structure 300 may represent one possible embodiment of the address table or index region described above. In such an embodiment, the data structure 300 (address table or index region) may be configured to store a bad or errored memory address (or memory region, such as a page). In various embodiments, these bad memory addresses may be received from the host device or processor. In various embodiments, the data structure 300 may be protected by its own form of ECC.

In the illustrated embodiment, each row of the data structure 300 may be considered a memory address entry. In such an embodiment, the data structure 300 may include the column 312 that indicate which memory address is bad. This may be the column 312 that is checked when a memory access occurs to determine if the memory access should be fulfilled by the HBM memory cells or the spare storage, as described above.

In the illustrated embodiment, each memory address entry may include a valid bit or flag column 314. In such an embodiment, this valid flag 314 may indicate if the respective memory address entry is in use. In such an embodiment, the valid flag 314 may be set when the host or processor writes the entry into the data structure 300. In another embodiment, the data structure 300 may be erased periodically (e.g., as part of a reboot) and may not include the valid flag 314.

In various embodiments, each memory address entry may include a type field of column 315. In such an embodiment, this field 315 may not be included as the error amelioration may be uniform or for the same size (e.g., word or row based) across all addresses. However, in the illustrated embodiment, each address may be associated with a different level, amount, or type of error amelioration, such as 1-bit, 1-word, or a various number of bits. In some embodiments, the field 315 may include the number of bits past the memory address that are corrected. However, in the illustrated embodiment, predefined may be employed, such as a value of 1 for 1-bit, a value of 2 for 1-word, and so on. It is understood that the above are merely a few illustrative examples to which the disclosed subject matter is not limited.

In the illustrated embodiment, each memory address entry may include a mapped address column 316. In such an embodiment, the mapped address 316 may be the memory address or location in the spare storage, in which data associated with bad memory address (column 312) is actually stored. In such an embodiment, when a memory access occurs to the bad memory address, not only if the access redirected to the spare storage but also re-addressed to the mapped memory address 316. In various embodiments, this may be a fixed mapping. In the illustrated embodiment, the mapping may be 1-to-1. However, in another embodiment, the mapping may be set associative or employ another scheme.

In the illustrated embodiment, data structure 300 may include the memory address entry Address #1, with a valid flag of 1 or Set, and be mapped to the address #M1. Likewise, the memory address entry Address #2, may include a valid flag of 1 or Set and be mapped to the address #M2. A number of other memory address entries may exist. Finally, the memory address entry Address #N, may include a valid flag of 0 or cleared, and be mapped to the address #MN. It is understood that the above are merely a few illustrative examples to which the disclosed subject matter is not limited.

In the illustrated embodiment, the data structure 302 may include a plurality of memory cells, each configured to store data at respective memory addresses. In various embodiments, the data structure 302 may employ ECC protection. As described above, as write memory accesses to bad memory addresses occur, the new data may be stored in the spare storage or data structure 302 (e.g., Data #1, Data #2, Data #N). As described above, where the data is stored may be based upon the memory address entries.

In various embodiments, the data structure 302 may be of any size. In one such embodiment, the data structure 302 may include 150 kilobytes; although, it is understood that the above is merely one illustrative example to which the disclosed subject matter is not limited. In various embodiments, the level of granularity may also be of variable size (e.g., 256 bits).

In some embodiments, the RAS circuit may include multiple data structure 302 and/or 300 to accommodate different sizes or error patterns. For example, in various embodiments, the RAS circuit may accommodate error patterns of and include data structures for: single bit data errors, single word data errors, single row data errors, and/or single column data errors. It is understood that the above are merely a few illustrative examples to which the disclosed subject matter is not limited.

Figure 4A:
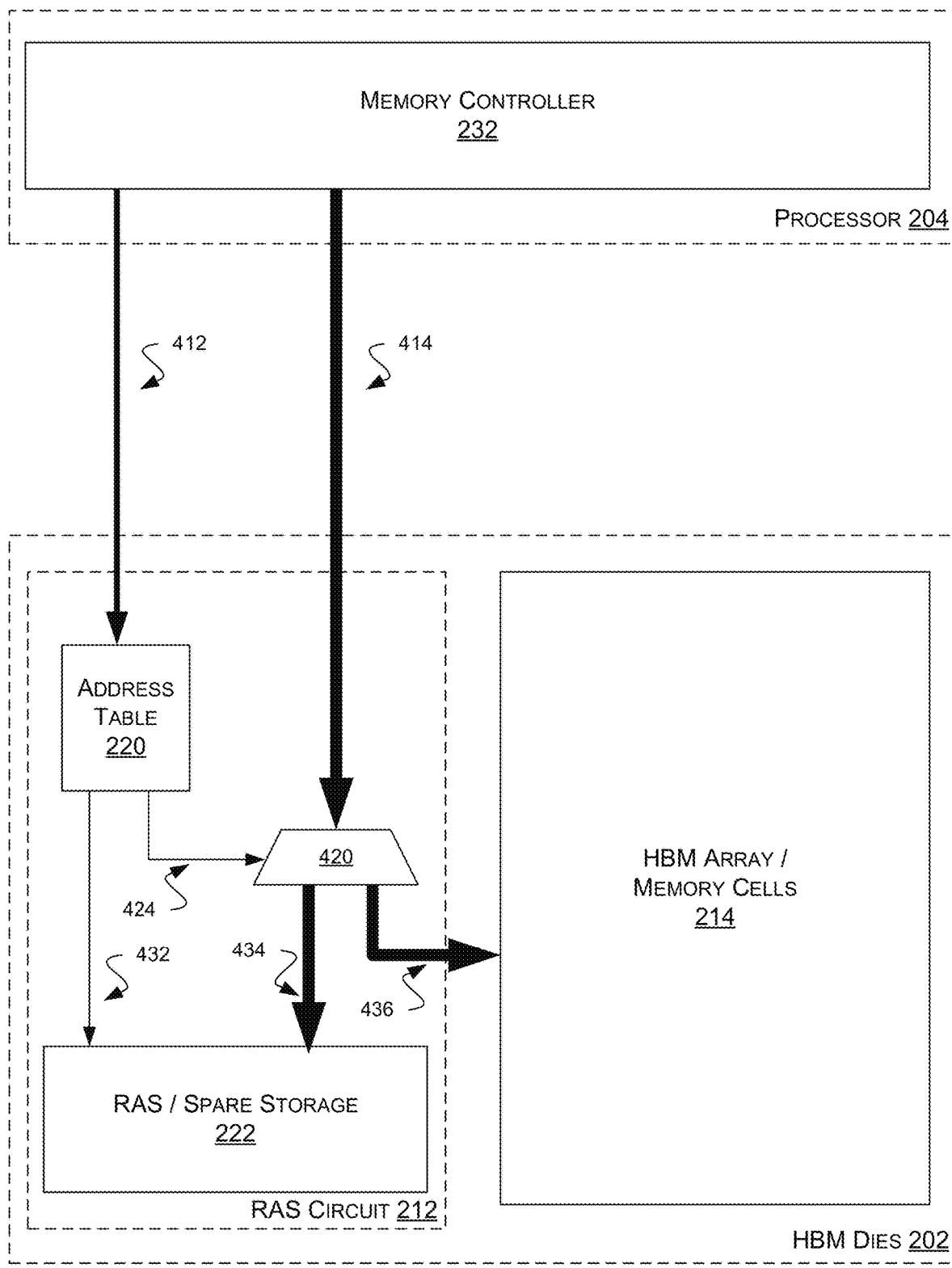
FIG. 4A is a block diagram of an example embodiment of a system in accordance with the disclosed subject matter.

FIG. 4A is a block diagram of an example embodiment of a system 400 in accordance with the disclosed subject matter. In the illustrated embodiment, a write memory access is shown. It is understood that the above is merely one illustrative example to which the disclosed subject matter is not limited.

In the illustrated embodiment, the system 400 may include a processor 204 and HBM dies 202, as described above. In various embodiments, the processor 204 may include a memory controller 232. The HBM dies 202 may include the HBM array or memory cells 214 (which may include ECC storage), and the RAS circuit 212, as described above. In the illustrated embodiment, the RAS circuit 212 may include the index region or address table 220, and the RAS or spare storage 222, as described above. In the illustrated embodiment, the system 400 may also include the command bus 412 and the data bus 414.

In the illustrated embodiment, the memory controller 232 may issue a write memory access to the HBM dies 202. In such an embodiment, the command itself (and the memory address) may be transmitted by the command bus 412 and the data to be written may be transmitted by the data bus 414. It is understood that the above is merely one illustrative example to which the disclosed subject matter is not limited.

Upon receipt of the write memory access, the RAS circuit 212 may determine if the memory address associated with the memory access is listed in the address table 220 (and valid). The address table 220 may produce an address table hit (if the address is listed) or an address table miss (if the address is not listed). This is shown by signal 424.

In the illustrated embodiment, the RAS circuit 212 may include a demultiplexer (DeMUX) or routing circuit 420. The routing circuit 420 may be configured to route the data to either the memory cells 214 or the spare storage 222, depending on the address table hit/miss 424. As described above, if an address table hit occurred, the routing circuit 420 may send the data to be written to the spare storage (shown by arrow 434). Likewise, the address table 220 may generate the mapped memory address 432, and send it to the spare storage 222. Conversely and also described above, if an address table miss occurred, the routing circuit 420 may send the data to be written to the memory cells 214 (shown by arrow 436). Likewise, but not shown, the memory address from the command bus 412 may be used by the memory cells 214 to store the data.

In various embodiments, the data may always be written to the memory cells, regardless of whether or not an address table hit/miss occurs. In such an embodiment, the logic for performing memory accesses to the memory cells 214 need not be altered to accommodate the addition of the RAS circuit 212. In such an embodiment, when an address table hit occurs the data may be written to both the memory cells 214 and the spare storage 222, but the data in the memory cells 214 may just be ignored, as shown below. It is understood that the above is merely one illustrative example to which the disclosed subject matter is not limited.

Figure 4B:
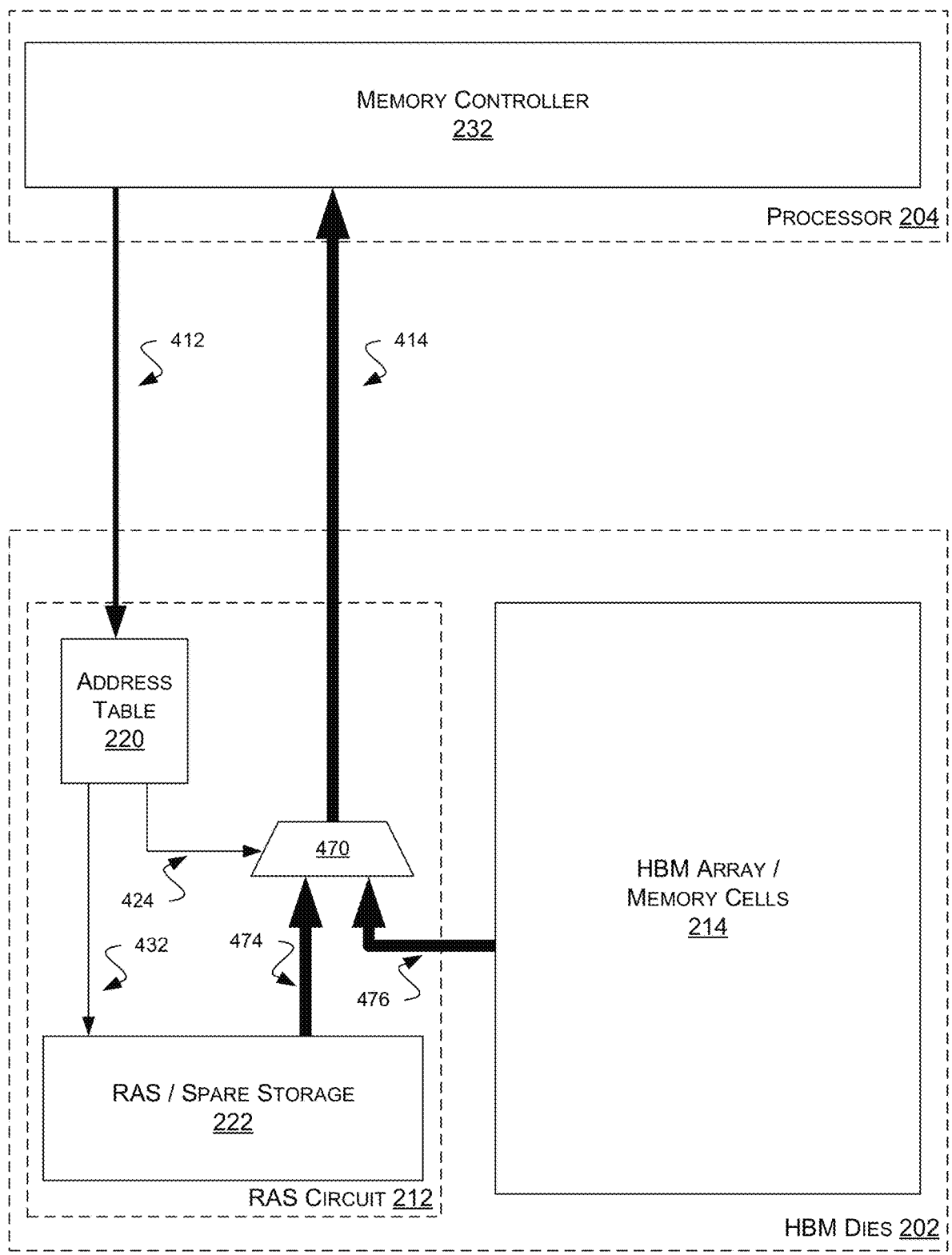
FIG. 4B is a block diagram of an example embodiment of a system in accordance with the disclosed subject matter.

FIG. 4B is a block diagram of an example embodiment of a system 401 in accordance with the disclosed subject matter. In the illustrated embodiment, a read memory access is shown. It is understood that the above is merely one illustrative example to which the disclosed subject matter is not limited.

In the illustrated embodiment, the system 401 may include a processor 204 and HBM dies 202, as described above. In various embodiments, the processor 204 may include a memory controller 232. The HBM dies 202 may include the HBM array or memory cells 214 (which may include ECC storage), and the RAS circuit 212, as described above. In the illustrated embodiment, the RAS circuit 212 may include the index region or address table 220, and the RAS or spare storage 222, as described above. In the illustrated embodiment, the system 400 may also include the command bus 412 and the data bus 414.

In the illustrated embodiment, the memory controller 232 may issue a read memory access to the HBM dies 202. In such an embodiment, the command itself (and the memory address) may be transmitted by the command bus 412 and the data will be returned by the data bus 414. It is understood that the above is merely one illustrative example to which the disclosed subject matter is not limited.

Upon receipt of the write memory access, the RAS circuit 212 may determine if the memory address associated with the memory access is listed in the address table 220 (and valid). The address table 220 may produce an address table hit (if the address is listed) or an address table miss (if the address is not listed). This is shown by signal 424.

In the illustrated embodiment, the RAS circuit 212 may include a multiplexer (MUX), gating, or routing circuit 470. The routing circuit 470 may be configured to route the data from either the memory cells 214 or the spare storage 222 to the data bus 414, depending on the address table hit/miss 424. As described above, if an address table hit occurred, the routing circuit 470 may send the retrieved data from the spare storage (shown by arrow 474) to the data bus 414. Likewise, the address table 220 may generate the mapped memory address 432, and send it to the spare storage 222. Conversely and also described above, if an address table miss occurred, the routing circuit 420 may send the retrieved data from the memory cells 214 (shown by arrow 476) to the data bus 414. Likewise, but not shown, the memory address from the command bus 412 may be used by the memory cells 214 to retrieve the data.

In various embodiments, the data may always be written to the memory cells, regardless of whether or not an address table hit/miss occurs, as described above. In such an embodiment, while the data is stored in the bad or errored memory address of the memory cells 214, the routing circuit 470 prevents the bad or errored data from being placed on the data bus 414. Instead, the good data from the spare storage 222 is used. In such an embodiment, data may always be read from the memory cells 214 but then gated by the routing circuit 470.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   stacked integrated circuit dies comprising:
   a memory cell die configured to store data based, at least in part, on a memory address; and
   a logic die comprising:
   an interface to the stacked integrated circuit dies and configured to communicate memory accesses between the memory cell die and an external device, and
   a reliability circuit comprising:
   a spare memory configured to store data, and
   an address table configured to map a memory address associated with an error to a portion of the spare memory,
   wherein the reliability circuit is configured to, based on a detected error command from a processor external to the logic die, edit a memory address entry of the address table;
   wherein the reliability circuit is configured to, based on a memory access to the stacked integrated circuit dies, determine that the memory access is associated with an error, and complete the memory access with, at least in part, the spare memory.

2. The apparatus of claim 1, wherein the address table comprises:
   an error correction code portion to protect against errors in the address table, and a valid flag configured to indicate that the memory address entry is active.

3. The apparatus of claim 1, wherein the reliability circuit is configured to:
receive a write memory access, from an external device, for data at a memory address;
determine that the memory address is associated with an error; and
write the data to a portion of the spare memory.

4. The apparatus of claim 3, wherein the reliability circuit is configured to determine that the memory address is associated with an error by:
determining that the memory address is stored within the address table as a memory address entry, and
determining that a valid flag indicates that the memory address entry is active.

5. The apparatus of claim 1, wherein the reliability circuit is configured to:
receive a read memory access, from an external device, for data at a memory address;
determine that the memory address is associated with an error; and
retrieve the data from a portion of the spare memory.

6. The apparatus of claim 1, wherein the reliability circuit is configured to:
receive a message from an external device indicating that a memory address is associated with an error;
place the memory address in the address table; and
associate the memory address with the portion of the spare memory.

7. The apparatus of claim 6, wherein the reliability circuit is configured to receive a message from an external device indicating that a memory address is associated with an error by:
receiving a write memory access to a predefined memory address, wherein the predefined memory address is associated with the address table.

8. The apparatus of claim 1, wherein the reliability circuit is configured to:
monitor a usage level of the spare memory, and
store an indicator of the usage level at a predefined memory address; and
wherein the interface is configured to:
receive a read memory access to the predefined memory address, and
based on the read memory access, provide the indicator of the usage level of the spare memory.

9. A system comprising:
a processor comprising:
a memory controller configured to manage a flow of data to and from the processor, and
an error correction circuit configured to detect an error associated with stored data; and
a high-bandwidth memory stack of integrated circuits, separate from the processor, comprising:
high-bandwidth memory cells configured to store data based, at least in part, on a memory address, and
a reliability circuit comprising:
a spare memory configured to store data, and
an address table configured to map a memory address associated with the error to a portion of the spare memory
wherein the reliability circuit is configured to, based on a memory access to the high-bandwidth memory stack of integrated circuits, determine that the memory access is associated with an error detected by the error correction circuit, and complete the memory access with, at least in part, the spare memory.

10. The system of claim 9, wherein the processor is configured to:
determine that the spare memory includes sufficient free capacity to correct, at least partially, the error, and
cause the reliability circuit to map the memory address associated with the error to a portion of the spare memory.

11. The system of claim 9, wherein the reliability circuit is configured to:
receive a write memory access, from the processor, for data at a memory address;
determine that the memory address is associated with an error; and
write the data to a mapped portion of the spare memory.

12. The system of claim 9, wherein the reliability circuit is configured to:
receive a read memory access, from the processor, for data at a memory address;
determine that the memory address is associated with an error; and
retrieve the data from a mapped portion of the spare memory.

13. The system of claim 9, wherein the processor is configured to issue a write memory access to a predefined memory address, wherein the predefined memory address is associated with the address table and wherein the write memory access includes the memory address associated with the error as a piece of data
wherein the reliability circuit is configured to:
receive a message, from the processor, indicating that a memory address is associated with an error;
place the memory address in the address table; and
associate the memory address with the portion of the spare memory.

14. The system of claim 9, wherein the reliability circuit is configured to:
monitor a usage level of the spare memory, and
store an indicator of the usage level at a predefined memory address, and
wherein the processor is configured to:
issue a read memory access to the predefined memory address, and
receive, based on the read memory access, an indicator of the usage level of the spare memory.

15. The system of claim 9, wherein the processor includes a non-volatile memory configured to store a list of memory addresses associated with respective errors, and
wherein the error correction circuit is configured to, based on detecting an error to stored data cause the memory address associated with the error to be stored by both the non-volatile memory and the address table.

16. The system of claim 15, wherein non-volatile memory is configured to add one or more of the list of memory addresses associated with respective errors to the address table; and
wherein the reliability circuit is configured to map one or more of the memory addresses to respective positions of the spare memory.

17. The system of claim 9, wherein the reliability circuit is configured to remap data errors within the high-bandwidth memory cells without resetting the processor.

18. An apparatus comprising:
a logic die comprising:
- an internal interface to a high-bandwidth memory die, wherein the high-bandwidth memory die configured to store data based upon a memory address;
- an external interface configured to communicate memory accesses between the high-bandwidth memory die and at least one external device; and
- a reliability circuit comprising:
  - a spare memory configured to store data, and
  - an address table configured to map a memory address associated with an error to a portion of the spare memory, and
  - wherein the reliability circuit is configured to, based on a detected error command from a processor external to the logic die, edit a memory address entry of the address table;

wherein the reliability circuit is configured to, based on a memory access to the high-bandwidth memory die, determine that the memory access is associated with an error, and complete the memory access with, at least in part, the spare memory.

19. The apparatus of claim 18, wherein the reliability circuit is configured to:
- receive a write memory access, from the external device, for data at a memory address;
- determine that the memory address is associated with an error; and
- write the data to a portion of the spare memory.

20. The apparatus of claim 18, wherein the reliability circuit is configured to:
- receive a read memory access, from the external device, for data at a memory address;
- determine that the memory address is associated with an error; and
- retrieve the data from a mapped portion of the spare memory.

* * * * *